(12) United States Patent
Giefers (10) Patent No.: US 8,033,859 B2
(45) Date of Patent: *Oct. 11, 2011

(54) CONNECTION AND JUNCTION BOX FOR A SOLAR MODULE

(75) Inventor: Stefan Giefers, Detmold (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/525,784

(22) PCT Filed: Feb. 4, 2008

(86) PCT No.: PCT/EP2008/000859
§ 371 (c)(1),
(2), (4) Date: Feb. 16, 2010

(87) PCT Pub. No.: WO2008/095670
PCT Pub. Date: Aug. 14, 2008

(65) Prior Publication Data
US 2010/0139760 A1    Jun. 10, 2010

(30) Foreign Application Priority Data

| Feb. 5, 2007 | (DE) | 10 2007 006 433 |
| Aug. 7, 2007 | (DE) | 10 2007 037 130 |
| Sep. 7, 2007 | (DE) | 10 2007 042 457 |
| Oct. 24, 2007 | (DE) | 10 2007 051 134 |

(51) Int. Cl.
*H01R 4/24* (2006.01)

(52) U.S. Cl. ........................................ 439/441

(58) Field of Classification Search .............. 439/441, 439/709, 835, 535; 174/59
See application file for complete search history.

(56) References Cited

U.S. PATENT DOCUMENTS

| 4,460,232 A * | 7/1984 | Sotolongo ................ 439/535 |
| 6,344,612 B1 * | 2/2002 | Kuwahara et al. ........... 174/50 |
| 7,097,516 B2 * | 8/2006 | Werner et al. .............. 439/709 |
| 7,618,265 B2 * | 11/2009 | Rueggen et al. ............ 439/76.1 |
| 7,648,371 B2 * | 1/2010 | Boensch et al. ............ 439/76.1 |
| 7,824,190 B2 * | 11/2010 | Beck et al. ................ 439/76.1 |
| 2006/0049802 A1 | 3/2006 | Higashikozono |
| 2009/0272559 A1 * | 11/2009 | Richter et al. .............. 174/59 |

FOREIGN PATENT DOCUMENTS

| DE | 203 11 184 U1 | 2/2004 |
| DE | 10 2004 020 958 | 8/2005 |
| DE | 103 58 140 | 9/2005 |
| DE | 20 2005 018 884 | 3/2006 |
| DE | 10 2005 025 632 | 12/2006 |
| EP | 1 102 354 A | 5/2001 |
| EP | 1 672 702 A | 6/2006 |
| WO | WO 2007/118798 | 10/2007 |

* cited by examiner

*Primary Examiner* — Phuong K Dinh
(74) *Attorney, Agent, or Firm* — Reising Ethington PC (57) ABSTRACT

The invention relates to a connection and junction box (1) for a photovoltaic solar module (24), which box in a mounting state, is put on the solar module (24) with open contact clamp (s) (22), and the contact clamps are actively closed for contacting the flexible flat conductor band(s) (28). Preferably, the actuating the contact clamp(s) (22) is automatically carried out by means of a device between two housing parts (2, 50), when putting on.

14 Claims, 6 Drawing Sheets

CONNECTION AND JUNCTION BOX FOR A SOLAR MODULE

FIELD OF THE INVENTION

The invention relates to a connection and junction box for a photovoltaic solar module having flexible flat conductor bands protruding from the surface of the solar module, and to a method for connecting a connection and junction box to a solar module.

BACKGROUND OF THE INVENTION

Over the past years, producing photovoltaic solar modules has literally been booming, inter alia due to the increased demand on environmentally sound energy production. The direct conversion of sunlight into electric current by means of photovoltaic solar modules is entirely emission-free, and no risks for humans and the environment are almost involved. For example, complete roofs of new buildings are therefore recently overlaid with solar modules, and even "solar power plants" are built. Due to the technical development of photovoltaics, using solar modules more and more becomes efficient even in more unfavourable latitudes such as Middle Europe and Northern America so that especially in these regions there is a great demand. Due to the continuous progress of the efficiency of solar modules due to technical further development on the one hand as well as increasing costs of energy production with other energy carriers as fossil fuels or nuclear energy, photovoltaic power generation becomes more and more competitive.

It is apparent that the success of solar modules in economic competition with other energy carriers depends on the costs of producing and mounting the solar modules.

Typically, solar modules consist of a plurality of solar cells based on semiconductor technique, which cells are interconnected to large-scale solar panels. A typical solar module has a glass plate on its side facing the sun, and a transparent plastics layer on the rear side, in which layer the solar cells are embedded. Typically, the rear side of the solar module is covered with a weather-resistant plastics compound foil, for example polyvinyl fluoride and polyester. The mono- or polycrystalline solar cells are electrically interconnected to each other by means of small solder wires. Typically, the solar module is furthermore mounted in a metal profile frame for fixing and stiffening the compound. Therefore, a solar module basically is a two-dimensional entity, similar to a thick glass plate.

Typically, solar modules have thin flexible conductor bands on the side facing away from the sun. These bands are mostly made of copper and vertically protrude from the rear side of the solar module. These flexible conductor bands are very sensitive and therefore difficult to contact. Additionally, a mechanical charge for fixing an electrical connector is also difficult because of the disk-like form of the solar module. Therefore, a special kind of electrical connectors has evolved for such solar modules, which kind is called connection box or connection and junction box. Typically, the connection and junction box is glued on the rearward surface of the solar module, and has electrical connection devices inside for contacting the flexible flat conductor bands of the solar module. Furthermore, if needed, the connection and junction box has an apparatus for connecting an electrical connection cable, which is connected with the flexible flat conductor band of the solar module by means of the connection and junction box for conducting the electrical current generated by the solar module.

Furthermore, several solar modules are typically operated in series connection, wherein a so-called bypass diode or free-wheeling diode is anti-parallel connected to each module. Inside the connection and junction box, the free-wheeling diode is connected to the electrical connection device. If a module is shaded or does not produce electricity because of a defect, this module would lower the power of the solar modules in series connection or even suffers damage without bypass diode. This is avoided by the bypass diode, because the current flows through the diode and is sustained.

It is apparent that due to the mechanical conditions, particularly the form of the solar module and the sensitiveness of the flexible flat conductor bands, a number of difficulties occur, when constructing the connection and junction box.

Up to now, connection boxes are known, which are put over the flexible flat conductor bands. When doing so, the flexible flat conductor band is manually bent and contacted by means of a contact clamp or a soldered connection. The connection box is closed in a further process step. Such connection arrangements or connection boxes respectively are described in DE 10 2005 025 632 A1 and DE 20 2005 018 884 U1. It is apparent that mounting such connection devices or connection boxes respectively is laborious, and is badly suited for automated mass production.

An electrical connection and junction box for a solar module is known from DE 103 58 140 B4, which box has a guiding arrangement at its lower side. The thin conductor band is guided in this guiding arrangement in lateral direction with low slackness in order to avoid buckling or folding the conductor bands, when inserting into the clamp apparatus. At this, it is disadvantageous that the conductor band has to be threaded into the narrow guiding arrangement, and the clamping force of the clamp arrangement may nevertheless be relatively low to be able to insert the thin conductor band into the clamp arrangement.

After all this, there is need for improvements in this regard, due to the high pressure to innovate in producing solar modules.

SUMMARY OF THE INVENTION

Therefore, it is an object of the present invention to provide a connection and junction box for a photovoltaic solar module, which box may easily, fast, and efficiently, in particular automatically, e.g. by means of a robot, be connected to the solar module.

It is a further object of the invention to provide such a connection and junction box, which offers high contact reliability and long-life cycle.

It is a further object of the invention to provide such a connection and junction box, which avoids, or at least lowers the disadvantages of the state of the art, and may cost-effectively be produced as well as be mounted.

The object is solved by the subject matter of the independent claims. Advantageous embodiments are subject of the dependent claims.

According to the invention, a connection and junction box for a photovoltaic solar module is provided for contacting one or more flexible flat conductor bands protruding from the surface of the solar module.

The connection and junction box comprises a dielectric housing for putting on the solar module, and has an insertion mouth at the lower side of the housing. It is apparent that the term "lower side" is not to be understood in the sense of absolute orientation in space, but the side of the connection and junction box or of the housing respectively is referred to as lower side, which faces the solar module, when in mounted state. I.e. the side engaging the solar module.

At the lower side of the housing, an insertion mouth is provided, into which the flat conductor band is automatically inserted, when the housing is put with the insertion mouth over the flat conductor band. In particular, the insertion mouth is essentially larger formed than the size of the flat conductor band in order that the flat conductor band may freely be inserted into the housing straight-line and without being guided by the housing. This has the advantage that the flat conductor band does not engage the housing. By this, the danger of the sensitive flat conductor band being damaged may be avoided, particularly folding the band during insertion.

In the housing, an electric connection device is positioned, which has a contact clamp for electrically contacting the flexible flat conductor band. In the mounting state, in which the housing is put on the solar module, and over the flat conductor band, the contact clamp is open in order to make possible that the sensitive flat conductor band may be inserted into a free area inside the open contact clamp without abutting upon. In this area, the flat conductor band is taken (grasped) and contacted when closing the contact clamp. Therefore, this area of the contact clamp is called catch area. Thus, the connection and junction box has two different states, namely the mounting state, in which the contact clamp is open, and the contacting state, in which the contact clamp is closed, holding and electrically contacting the flat conductor band.

Closing the contact clamp, i.e. transforming the connection and junction box from the mounting state into the contacting state is effected by actively actuating the contact clamp by means of an actuation arrangement after the connection and junction box is put on the solar module and the flexible flat conductor band is inserted into the housing. Depending on the design of the connection and junction box, actuation may be carried out immediately during the put-on process in a single production step, or after putting on in a second step. For doing so, the actuation arrangement comprises an actuation nose inside the housing, e.g. an actuation rip or an actuation pin, which applies a force to the open contact clamp and closes it thereby.

With the present invention, actively closing the contact clamp advantageously allows a clamping force of gripping the flat conductor band, being selectable, and therewith, if wanted, being high. This advantageously affects the contact reliability and durability.

According to a preferred embodiment of the invention, the housing is at least two-piece formed, and the two housing parts are movable with respect to each other, e.g. slideable with respect to each other. In the mounting state, the first of the two housing parts furthermore protrudes the second of the two housing parts at the side facing the solar module. Therefore, at first only the first of the two housing parts engages the solar module, when putting on the connection and junction box. The connection and junction box is attached to this first housing part. By pushing the second housing part towards the solar module, the movement of the two housing parts with respect to each other, and therewith of the second housing part with respect to the connection device also, is started up, since the first housing part with the connection device supports itself at the solar module, and the actuation arrangement being fixed at the second housing part automatically closes the contact clamp. Advantageously, the contact clamp may therefore be closed exclusively by engaging the housing from the outside, and with no manual intervention.

For this purpose, one of the two housing parts conveniently has a plurality of guide sleeves, and the other housing part has alignment pins corresponding therewith, which together form a linear guide perpendicular to the surface of the solar module. In the mounting state, the alignment pins are in particular preferably not yet totally inserted into the guide sleeves, and self-locking or self-clamping fixed in this position so that the first housing part with the connection device does nor drop off, when the second housing part is taken, e.g. by a mounting robot, and put on the solar module from above. When putting the connection and junction box on the solar module, the self-locking of the sliding arrangement is overcome by applying a force to the second housing part towards the solar module for effecting the movement of the second housing part with respect to the first housing part, and for closing the contact clamp by means of the actuation arrangement at the second housing part. Therefore, closing the contact clamp is automatically carried out when putting on the connection and junction box, effected by the relative movement.

These measures make an especially easy and efficient automated mounting possible, mainly if the mounting robot picks the connection and junction box up from a feeding arrangement and only needs to linear move perpendicularly to the solar module, when putting the connection and junction box on the solar module.

Thus, the first housing part is formed as bottom element for engaging the solar module, but simultaneously serves as holding for the connection device, which is fixedly connected with the bottom element. For this, the bottom element provides latch elements for example, by means of which the connection device is latched at the bottom element. The second housing part is formed as cap part. At least one of the two housing parts, preferably the cap part, has circumferential side walls so that the first and the second housing part together define, except for predefined openings, for example at the lower side and at the side walls for inserting the connecting cable, a closed and at least impermeable to splash-water box for the connection arrangement, when the housing is fixedly connected with the solar module in the contacting state. Preferably, the cap part is formed hat-like, and has a circumferential lip with a glue notch for gluing the cap part on the surface of the solar module, in contacting state. In the contacting state, the bottom element as well as the cap element then flushly abuts the solar module. Thus, the bottom element does not necessarily need to cover the whole bottom of the connection and junction box. It is rather sufficient to dimension the bottom element such that it fulfils its function of supporting at the solar module, and of fixing the connection and junction box. If desired, the bottom element may be glued to the solar module, additionally to the cap element.

Preferably, the contact clamp is formed as a spring force clamp with a clamp spring, for example made of spring metal, and a counter clamp element, wherein the spring force clamp is open from itself in contacting state, and is closed by applying a force by means of the actuation arrangement. For this, the clamp spring has a latching mechanism latching the clamp spring in the open state, for example in the form of latch noses, which are superably inhibiting fixed behind projections at a holding frame of the contact clamp in the mounting state. It is hereby ensured that the contact clamp is securely kept open when being operated till it is actively closed overcoming the open snap-fit by means of the actuation arrangement.

In particular preferably, a contact clamp is used, with which the clamp spring and/or the counter clamp element is pivotably mounted at the holding frame of the connection device. Actuating the contact clamp then causes a pivoting of at least one of the clamp spring or of the counter clamp element for closing the contact clamp, and therefore closing the electrical contact with the flexible flat conductor band. Preferably, contacting the flat conductor band is carried out under an angle to the solar module normal (e.g. 45° or 90°). Therefore, the contact force of the contact clamp between the two contact elements (spring clamp and counter clamp element) has a vector component perpendicular to the surface of the solar module. Depending on the form of the contact clamp, the actuation arrangement may hereby be simplified, notwithstanding achieving a high and durable contacting reliability.

In the following, two embodiments are described in detail. Namely one, with which the flexible flat conductor band is directly inserted into the open catch area of the open contact clamp, when putting the connection and junction box on. With the other embodiment, the flexible flat conductor band is firstly inserted into an open intermediate area in the housing, when putting the connection and junction box on, and the connection and junction box has an deflection arrangement for the flexible flat conductor band, which arrangement bends the flexible flat conductor band from the intermediate area into the catch area of the contact clamp. In case of the secondarily mentioned embodiment, the deflection arrangement preferably comprises a deflection arm, which is actuated, when the connection and junction box is put on the solar module, and bends the flexible flat conductor band into the housing towards the contact clamp after insertion through the insertion mouth so that the flexible flat conductor band extends into the catch area after bending, and is then grasped and electrically contacted by closing the contact clamp.

It is common to both mentioned embodiments, that, in contrast to the state of the art described in the introduction, the contact clamp is not pressed open by means of the thin flat conductor band, but the flat conductor band is firstly substantially resistance-less, totally inserted through the insertion mouth into an open area in the housing of the connection and junction box. Particularly, the insertion mouth is significantly larger than the cross-section dimensions of the flat conductor band. Advantageously, the danger of damaging the sensitive flat conductor band may hereby be reduced.

In the following, the invention is described in more detail on the basis of embodiments and with reference to the figures, wherein same and similar elements of both embodiments are provided with same referral numerals, and the features of the two embodiments may be combined with each other.

BRIEF DESCRIPTION OF THE DRAWINGS

It is shown.

DETAILED DESCRIPTION OF THE INVENTION

Figure 1:
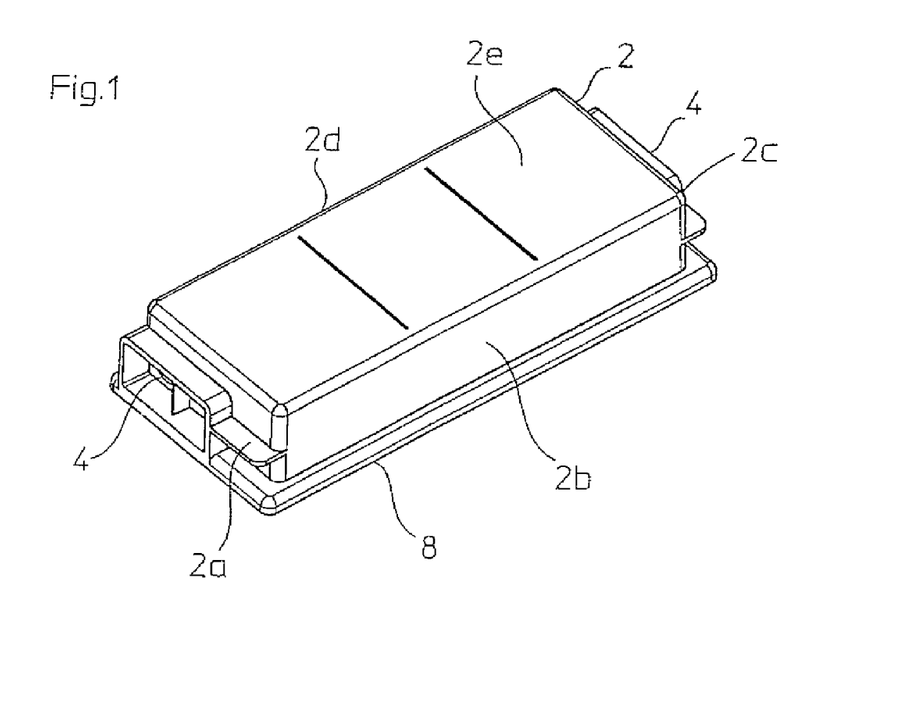
FIG. 1 a perspective view from above onto the housing cap of a first embodiment of the connection and junction box, FIG. 2 a perspective view from below onto and into the housing cap from FIG. 1, FIG. 3 cross section across the solar module through the connection and junction box according to the first embodiment with the electrical connection device in the open mounting state, FIG. 4 cross section across the solar module through the connection and junction box according to the first embodiment with the connection device in the closed contacting state, FIG. 5 a perspective view of two connection devices with the bottom element according to the first embodiment, FIG. 6 a perspective enlarged view of one of the connection devices from FIG. 5.
Figure 2:
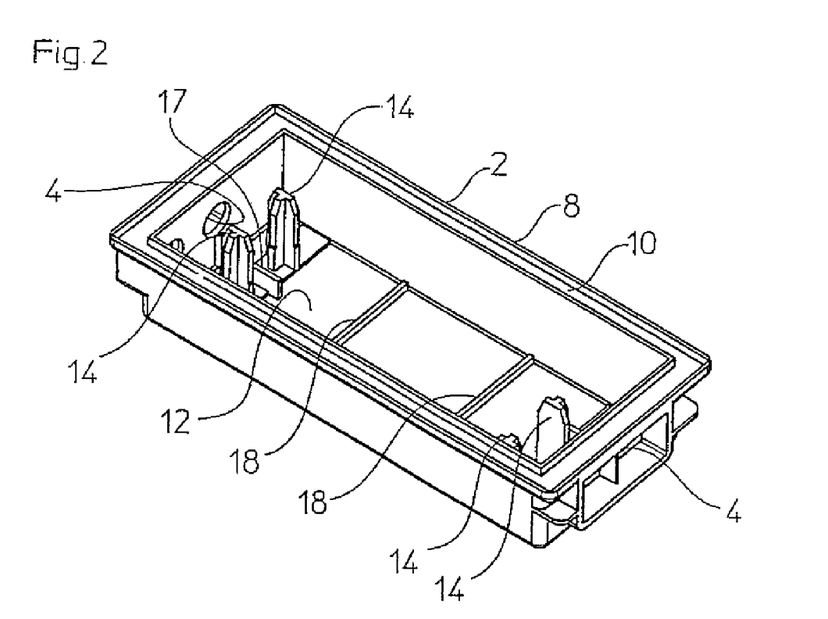

With reference to FIGS. 1-2, the connection and junction box has a housing cap 2 made of plastics. The housing cap 2 is formed by a substantially rectangular frame made of four side walls 2a to 2d, and of a closed cap plate 2e running parallel to the solar module. The housing cap 2 is closed on five sides and open downward. For example, it is injection-moulded from plastics. Separate fold protection grommets 6 (see FIG. 3 and FIG. 4) are each inserted into connection cable lead-throughs 4.

Referring to FIG. 2, the housing cap is downward open, and has a holding frame 8 projecting outward, which frame has a circumferential glue notch 10 so that the housing cap 2 has a hat-like shape. Finally, the connection and junction box is permanently glued on the solar module by means of the glue inserted in the glue notch 10. The hat-like or pan-like shape of the housing cap forms an inner hollow space 12, in which the connection devices not shown in FIG. 2 are substantially water-proof positioned in the mounted state.

Alignment pins 14 extend from the lower side of the cap plate 2e into the hollow space 12. A clamp bar 17 for the connection cable not being shown is provided between two alignment pins 14 on the inner side of the connection cable lead-throughs 4. Furthermore, the lower side of the cap plate 2e has two actuation arrangements 18. In this embodiment, the actuation arrangements 18, whose function will below be described even in more detail, are formed as actuation bars laterally proceeding, which are formed one-piece with the housing cap 2.

Figure 3:
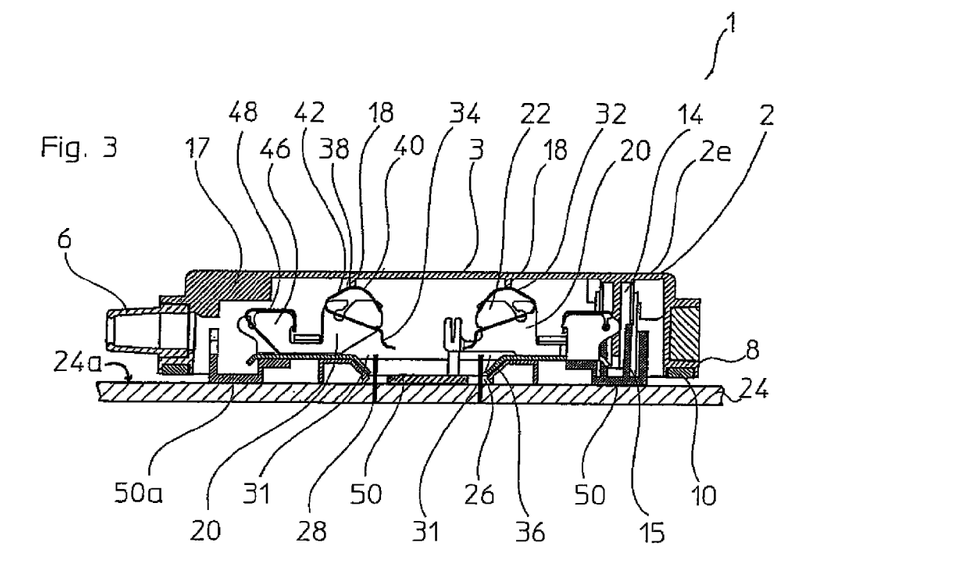

With reference to FIG. 3, two identical connection devices 20 are positioned in the housing 3 of the connection and junction box 1, which housing is formed by housing cap 2 and bottom element 50. Since the two connection devices 20 are identically formed, only one of the two connection devices 20 is referred to in the following.

FIG. 3 shows the connection and junction box in the mounting state, in which the contact clamp 22 is open. The bottom element 50, to which the connection device 20 is attached, has guide sleeves 15, into which the alignment pins 14 are inserted. The alignment pins 14 clamp in the associated guide sleeves 15 such that, when putting the connection and junction box 1 on the solar module 24, the bottom element 50 is hold by clamping at the housing cap 2 so that the housing 3 may be gripped at the housing cap 2, and automatically put on, without the bottom element 50 and the connection device 20 falling off. On the other hand, the clamping between the alignment pins 14 and the guide sleeves 15 may be overcome by applying a force for making a relative movement between the housing cap 2 and the bottom element 50 with the connection device 20 possible, namely, if a minimum force is exceeded. In this example, the guide sleeve 15 is slotted for improving the superably clamping co-action with the alignment pin 14.

In the open mounting state, the connection device 20 is not yet completely inserted into the housing cap 2, and the bottom element 50 protrudes a little (some millimetres) downwards from the housing cap 2, i.e. at the side facing the solar module. Therefore, there is an offset between the lower side 50*a* of the bottom element 50 and the holding frame 8 of the housing cap 2 in the mounting state so that, when putting the connection and junction box 1 on, firstly the bottom element 50 engages the solar module 24, and in this state shown in FIG. 3, the holding frame 8 is still spaced apart from the surface 24*a* of the solar module 24.

The bottom element 50 has a relatively large mouth 26 at its lower side 50*a* facing the solar module 24. In the mounting state, this ensures that the sensitive flexible flat conductor band 28, the so-called "ribbon", may barrier-free and resistance-less be inserted from below through the insertion mouth 26 into the housing 3 and the connection device 20. The danger of damaging the flat conductor band 28 is hereby reduced. In this state, the contact clamp 22 defines an open catch area 31, which the flat conductor band 28 enters from below, when putting on the connection and junction box. Preferably, there is yet no contact between the contact clamp 22 and the flat conductor band 28 so that inserting and contacting the flat conductor band takes place in two consecutive steps.

Now, a force is applied to the housing cap 2 against the solar module 24 for closing the contact clamp, whereas the bottom element 50 supports itself at the solar module 24. A linear relative movement between the housing cap 2 and the bottom element 50 with the connection device 20 is hereby caused having the effect that the housing cap 2 is slided over the bottom element 50 and the connection device 20 till the holding frame 8 with the glue notch 10 engages the surface 24*a* of the solar module 24, and the lower side of the bottom element 50 and of the housing cap 2 flushly abuts on the solar module 24. This state is shown in FIG. 4.

Figure 4:
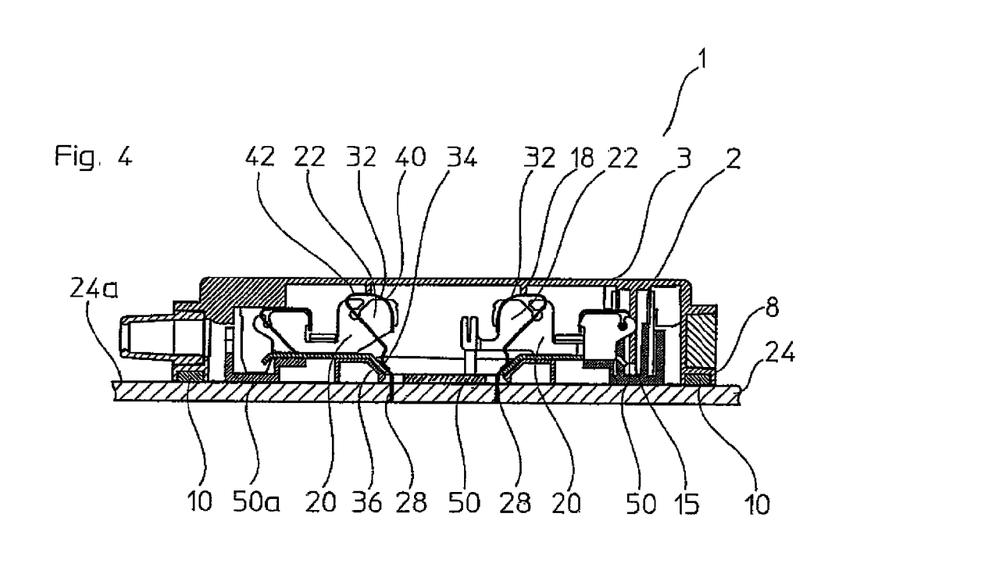

Referring to FIG. 4, the housing cap 2 is glued on the solar module by means of the glue being in the glue notch 10. The bottom element 50 may, but does not need to be glued to the solar module 24. During the relative movement of the housing cap 2 towards the bottom element 50 and the connection device 20, the actuation arrangement 18, an actuation bar in this example, furthermore interacts with the clamp spring 32. Due to this actuation, the contact clamp 22 is closed by pivoting the clamp spring 32. In doing so, the clamp section 34 of the clamp spring 32 passes through the catch area 31, and catches the upper end of the flat conductor band to electrically contacting clamp it between the clamping section 34 of the clamp spring 32 and the counter clamp element 36. When doing so, the flat conductor band 28 is bent, because the counter clamp element 26 is at about a 45° angle to the solar module normal, in this example.

The clamp spring 32 has an actuation section 38, which is divided into a curved section 40 and a substantially linear section 42. When closing, the actuation element 18 firstly acts on the curved section 40 (see FIG. 3) and tightens against the linear section 42, in the closed state of the connection and junction box 1, which state is shown in FIG. 4. I.e., when closing, the actuation element 18 passes over the actuation section 18 of the clamp spring 32.

Furthermore, the connection device 20 has a cable connection clamp 40 for the connection cable not being shown.

In this example, the cable connection clamp 40 is also provided with a clamp spring 48. In this juncture, other connection variants such as screw clamps may be used.

In the embodiment shown here, the connection and junction box 1 comprises two identically formed connection devices 20 for simultaneously contacting two flat conductor bands 28. But it is apparent that the invention is not limited thereto, and that the connection and junction box 1 may also comprise only one or more than two connection devices 20.

Figure 5:
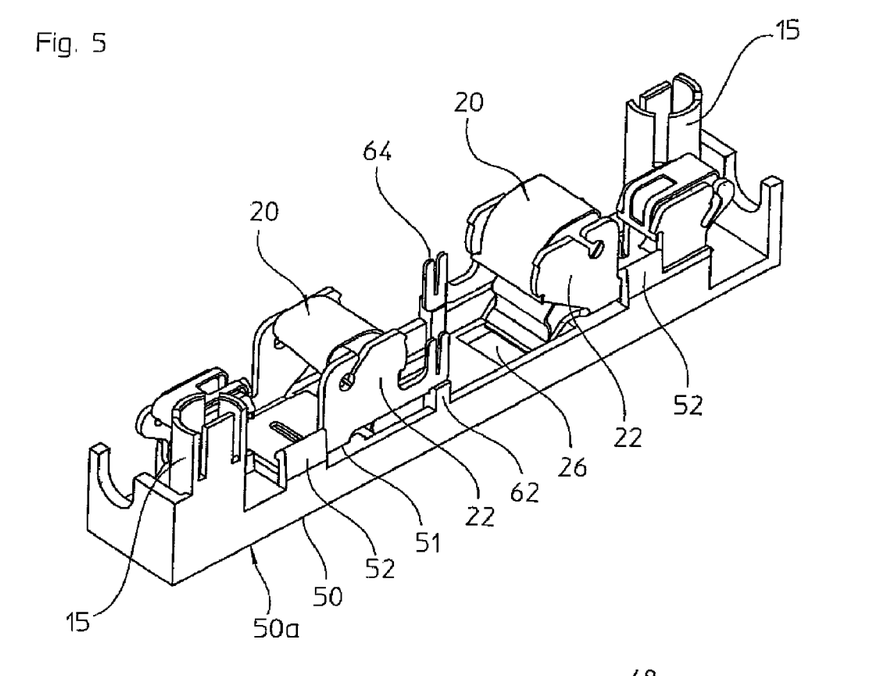

Referring to FIG. 5, the connection device 20 is attached at the bottom element 50, which is formed as a dielectric carrier preferably made from plastics, in this example. The lower side 50*a* of the bottom element 50 defines the primary area of engagement at the solar module 24 and the insertion mouth 26. The connection device 20 further has a substantially U-shaped metallic holding frame 51 preferably made from copper, which is latched at the bottom element 50 by means of snap-fits 52.

Figure 6:
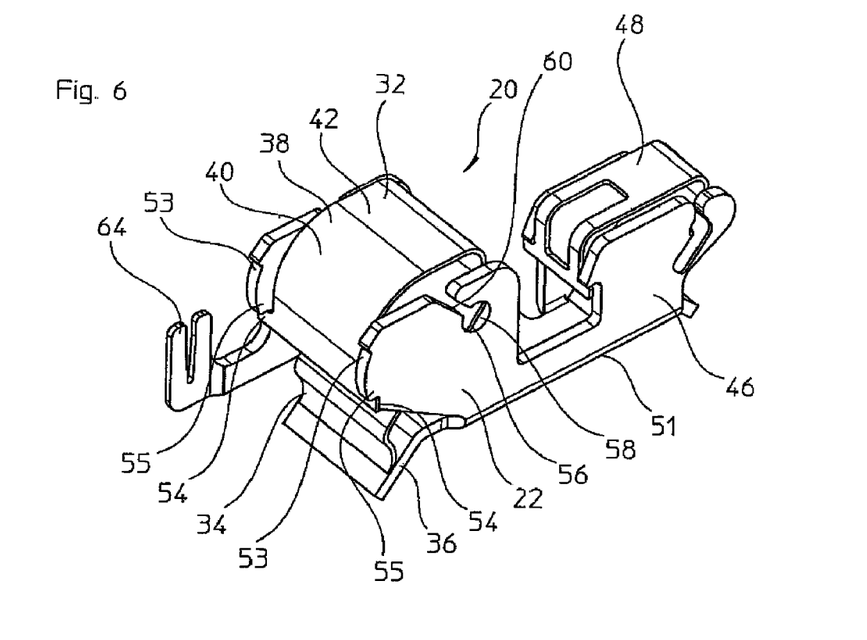

FIGS. 5 and 6 show the contact clamp 22 in the closed contacting state, in which the contact clamp 22 is latched. For this, the clamp spring 32 has two latching studs, which are latched behind corresponding noses 55 in the metallic holding frame 51. The contact spring 32 is pretensioned against the counter clamp 36 in this latched state. This provides for a permanent and firm electrical contact. The flat conductor band 28 is not shown in FIGS. 5 and 6.

Furthermore, the clamp spring 32 is hung up in slotted bearing openings 58 by means of bearing studs 56. Therefore, the clamp spring 32 may easily be inserted when producing the connection and junction box. Due to position of the flat bearing stud, which position is pivoted relatively to the slot 60 in the mounting and in the contacting state, the clamp spring 32 is secured. The clamp spring 32 is punched from sheet steel, and substantially U-shaped curved.

The metallic holding frame 51 may furthermore have a dielectric connection element for the bypass-diode, which element is supported by means of socket 62 at the bottom element 50.

Due to the form of the two sections 40, 42 of the actuation section 38 of the clamp spring 32, the clamp spring 32 is fixed in the open mounting state such that the catch area 31 is kept open in the mounting state. By putting the connection and junction box 1 on the solar module, the conductor band 28 protruding from the solar module directly reaches this catch area 31 from below, in case of the embodiments shown in FIGS. 1-6.

Due to the interaction between the housing cap 2 and the bottom element 50 with the connection device 20 by means of the actuation element 18, the clamp spring 32 is forced to leave the open position, and is caused to pivot.

The flat conductor band 28, which is in the catch area 31, is grasped by the clamp section 34 and pushed against the counter clamp element 36 due to the persisting pivoting in an angle of 45° in this example. At the end of the pivoting, the clamp spring latches with its latch noses 54 into the metallic holding frame 51, in the contacting or operating state (FIG. 4). Due to the pretension of the clamp spring 32, is a permanent and predefined pressing force is established between the flat conductor band 28 and the counter clamp element 36.

Referring to FIG. 2 again, four alignment pins 14 are provided in this example for being able to arrange the connection device 20 with the bottom element 50 at laterally different positions in the housing cap 2.

Figure 7:
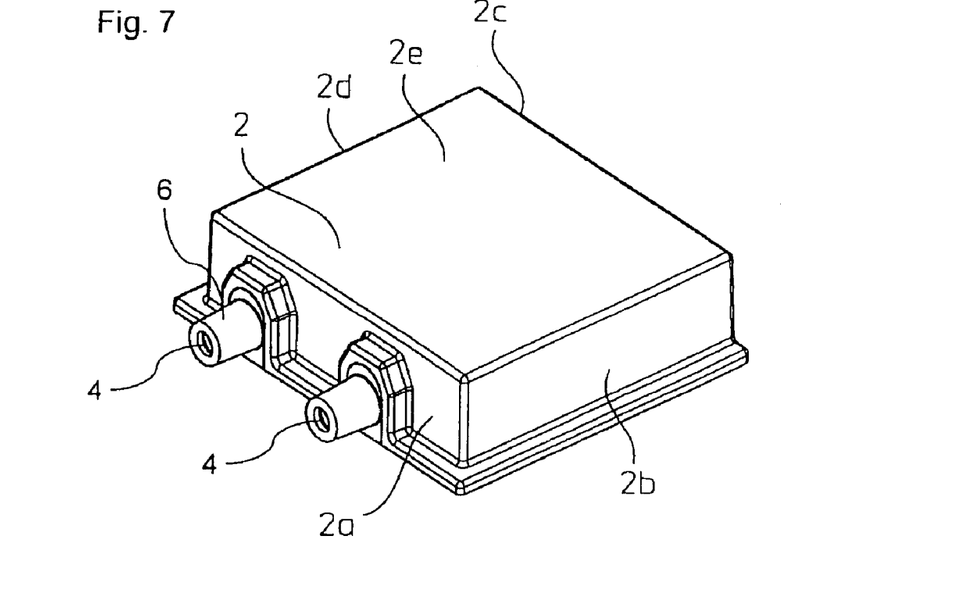
FIG. 7 is a perspective view from above onto the housing cap of a second embodiment of the connection and conjunction box.
Figure 8:
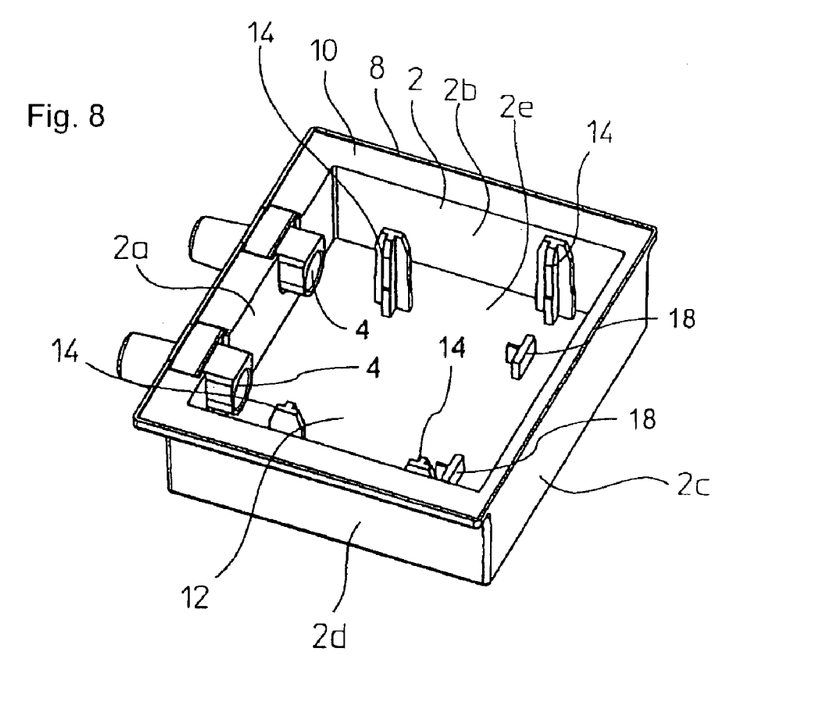
FIG. 8 is a perspective view from below onto and into the housing cap from FIG. 7.

FIGS. 7 and 8 show a connection and junction box 1 according to a second embodiment of the invention, with which the housing cap 2 is formed rather quadratic for arranging two connection devices 20 side by side instead of one after another as it is the case with the first embodiment (FIGS. 1-6). Since the contact clamp 22 and the sliding arrangement 14, 15 are formed identical for the most part with the first and the second embodiments, it is referred to the aforesaid description of the first embodiment for avoiding repetitions.

Figure 9:
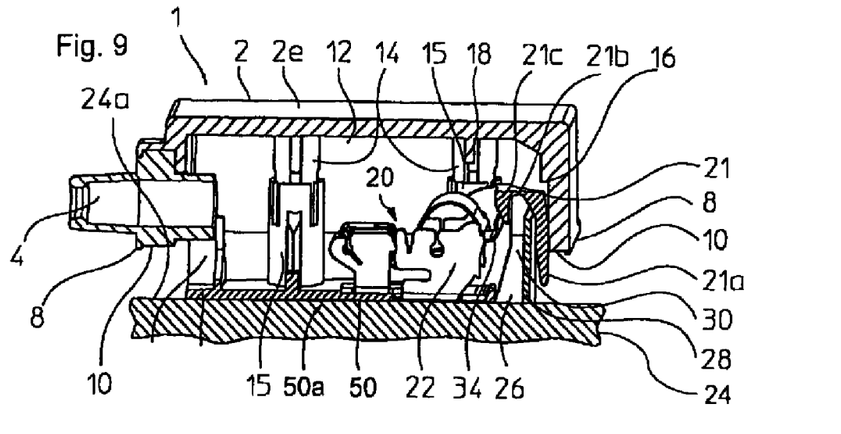
FIG. 9 is a cross section across the solar module through the connection and junction box according to the second embodiment with the electrical connection device in the open mounting state.
Figure 10:
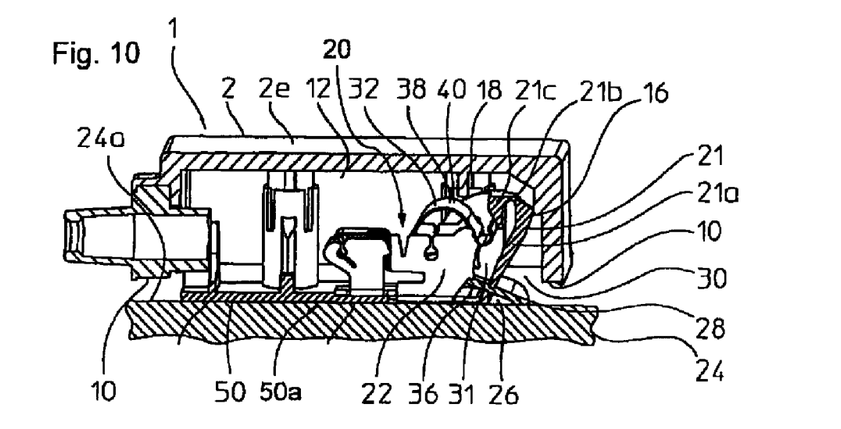
FIG. 10 is a cross section across the solar module through the connection and junction box from FIG. 9 with the connection device in the intermediate state.
Figure 11:
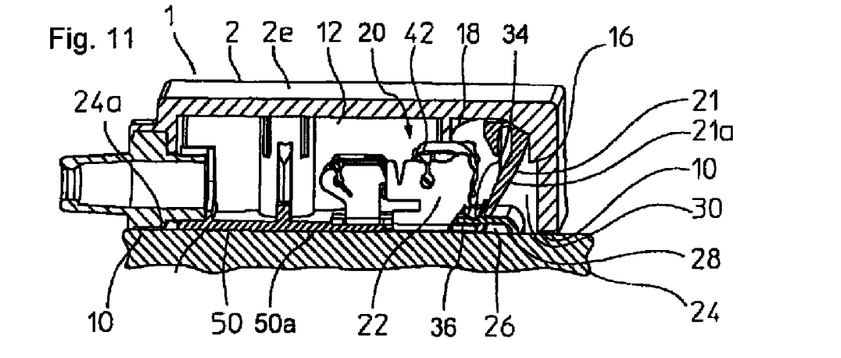
FIG. 11 is a cross section across the solar module through the connection and junction box from FIG. 9 with the connection device in the closed contact state.

The lower side of the cap plate 2e has a first actuation arrangement 14 in form of a lateral cam for actuating the deflection arm (not shown in FIG. 8, see hereunto FIGS. 9-11). Furthermore, actuation pins 18 for actuating the contact clamps protrude from the cap plate 2e into the internal space of the housing cap 2. In this embodiment, the cam 16 and the actuation device 18 are formed one-piece with the housing cap 2.

Figure 12:
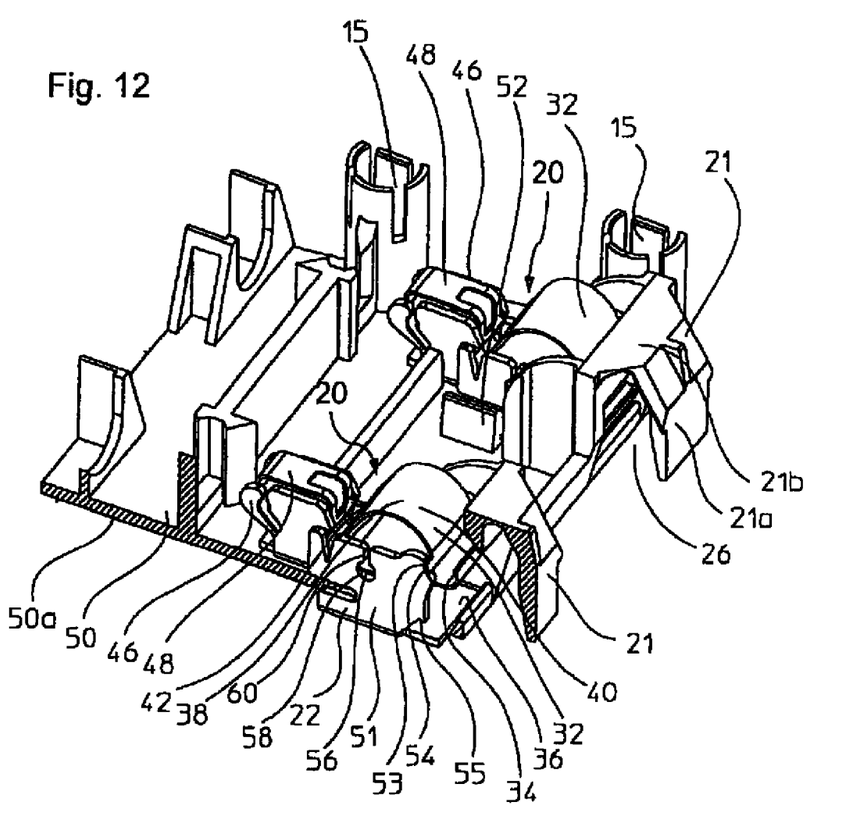
FIG. 12 is a perspective partially cut view of the bottom element with two connection devices according to the second embodiment.

Referring to FIGS. 9-11, the connection arrangement 20 is arranged in the housing 3 of the connection and junction box 1. Referring to FIG. 12, the connection and junction box also has two identical connection devices 20, wherein it is referred to only one of the two in the following.

FIG. 9 shows the connection and junction box, after it put over the flat conductor band 28. When putting over, the connection and junction box is in a first state, the mounting state, in which the deflection arm 21 is in a first position. In the mounting state, in which the connection and junction box is preferably delivered, the intermediate area 30 over the insertion mouth 26 is kept free, and the contact clamp 22 is open.

The connection and junction box 1 has a relatively large insertion mouth 26 at its side facing the solar module. This makes sure that the sensitive flexible flat conductor band 28, the so-called "ribbon", may barrier-free and resistance-less be inserted from below into the connection and junction box, when in mounting state. The danger of damaging the flat conductor band 28 is hereby reduced. In this state, the connection and junction box 1 defines an open intermediate or insertion area 30 between the contact clamp 22 and the deflection arm 21, which area the flat conductor band 28 resistance-less enters from below, when the connection and junction box is put on. Preferably, there is still no contact between the contact clamp 22 or the deflection arm 21, and the flat conductor band 28 in this state.

A force is now applied to the housing cap 2 against the solar module 24 for contacting the flat conductor band 28, wherein the connection device 20 supports itself at the solar module 24. A linear movement of the housing cap 2 with respect to the bottom element 50 with the connection arrangement 20 is hereby effected such that the housing cap 2 is slided over the connection device 20 till the holding frame 8 with the glue (not shown) being in the glue notch 10 engages the surface of the solar module 24, and the lower side 50a of the bottom element 50 and of the housing cap 2 flushly abuts the solar module 24. This closed contacting state represents the final or operating state, and is shown in FIG. 11. In the operating state, the housing 3 is glued on the solar module 24 by means of the glue being in the glue notch 10.

But before the connection and junction box 1 reaches the final state, it passes through intermediate state shown in FIG. 10, in which state the flat conductor band 28 is already bent, and the contact clamp 22 is still open. When putting the connection and junction box 1 on, the flat conductor band is therefore firstly inserted into the insertion area 30. Consecutively, the flat conductor band 28 is bent into the catch area 31 of the contact clamp 22 by means of the deflection arm 21, after the lower side 50a of the bottom element 50 has engaged on the solar module 24. Further consecutively, the contact clamp 22 is actively closed by means of the second actuation element 18. Thus, the connection and junction box 1 defines three predefined states, namely the mounting state (FIG. 9), in which the deflection arm 21 is in a first position so that the catch area is free and the contact clamp 22 is open, the intermediate state (FIG. 10), in which the flat conductor band 28 is bent into the catch area of the still open contact clamp 22 by means of the deflection arm 21, and the final or operating state (FIG. 11), in which the contact clamp 22 is closed, and establishes the electrical contact with the flat conductor band 28 by means of clamp contacting. With this embodiment, contacting the flat conductor band 28 is carried out parallel to the surface of the solar module 24.

During the relative movement between the housing cap 2 and the bottom element 50 and the connection device 20, the first actuation element 16, in this example an actuation cam, therefore firstly interacts with the deflection arm 21, and afterwards the second actuation element 18, in this example an actuation pin, with the clamp spring 32. By this consecutive actuation, the bending section 21a of the deflection arm 21 is firstly deflected in response to actuating by means of the cam 16. Afterwards, the contact clamp 22 is closed by means of pivoting the clamp spring 22. In this example, the cam 16 is formed as nose of the side wall of the housing cap 2 one-piece with the housing cap 2. Afterwards, the clamp section 34 of the clamp spring 32 passes over the catch area 31 of the contact clamp, and clamps and contacts the free end of the flat conductor band 28 between the clamp section 34 of the clamp spring 32 and the counter clamp element 36. The clamp section 21a of the deflection arm 21 is connected one-piece with a holding section 21c by means of a fold hinge 21b. The holding section 21c is attached at the bottom element 50, to be more precise, it is formed one-piece with the bottom element.

Referring to FIG. 12, the connection and junction box 1 comprises two connection devices 20, in this example. The connection devices are attached to the dielectric bottom element 50 on the top. FIG. 12 shows the contact clamp 22 in the open mounting state. The clamp spring 32 has two latch noses 54, each of which is superably clamped in recesses 53 in the metallic holding frame 53, in the open mounting state.

It is referred to FIGS. 9-11 again. Because of the housing cap 2 and the plastics bottom element 50 with the connection device 20 attached to it working together, the bending section 21a of the deflection arm 21 and the clamp spring 21 are caused to pivot by means of the actuation elements 16 and 18. At the end of the pivoting, the clamp spring latches with its latch noses 54 behind noses 55 in the holding frame 51, in the contacting state (FIG. 11). Due to the pretension of the clamp spring 32, a permanent and predefined pressing force is established between the flat conductor band 28 and the conducting counter clamp element 36.

It is apparent to the person skilled in the art that the above described embodiments should be understood as examples, and that the invention is not limited to them, but can be varied in a variety of ways without leaving the scope of the invention. Particularly, the connection and junction box may have one or a plurality of contact clamps for contacting one or a plurality of flat conductor bands in one box. Furthermore, it is apparent that the features also individually define essential parts of the invention, even if they are commonly described together with other features, not depending, whether they are disclosed in the description, the figures, or otherwise.

The invention claimed is:

1. A connection and junction box (1) for a photovoltaic solar module (24) having at least one flexible flat conductor band (28) protruding from the surface of the solar module, comprising a dielectric housing (3) to be put onto the solar module (24), having an insertion mouth (26) at the side (50a) of the housing, which side (50a) in mounted state faces the solar module (24), for inserting the flat conductor band (28) into the housing (3), wherein the housing (3) is formed at least two-piece, and the two housing parts (2, 50) are movable with respect to each other, a connection device (20) positioned in the housing (3), having a contact clamp (22) for electrically contacting the flexible flat conductor band (28), wherein the connection and junction box (1) defines a mounting state, and a contacting state, wherein the contact clamp (22) is open in the mounting state for being able to insert the flexible flat conductor band (28) into the open contact clamp (22), wherein the contact clamp (22) is closed in the contacting state for electrically contacting the flexible flat conductor band (28), wherein the connection and junction box (1) has an actuation arrangement (18) for closing the contact clamp (22), wherein the actuation arrangement (18) automatically closes the contact clamp (22) for contacting the flexible flat conductor band (28) in response to a movement of the two housing parts (2, 50) with respect to each other, after having put the connection and junction box (1) onto the solar module (24), and having inserted the flexible flat conductor band (28) into the housing (3).

2. The connection and junction box (1) according to claim 1, wherein the housing (3) has a sliding device (14, 15), by means of which the two housing parts (2, 50) are slideable with respect to each other laterally to the surface (24a) of the solar module (24), and the actuation device (18) automatically closes the contact clamp (22) in response to a relative movement of the two housing parts (2, 50), for contacting the flexible flat conductor band (28).

3. The connection and junction box (1) according to claim 2, wherein the sliding arrangement (14, 15) has a plurality of alignment pins (14) guided in guide sleeves (14), which pins are provided at the two housing parts (2, 50).

4. The connection and junction box (1) according to claim 3, wherein the sliding arrangement (14, 15) is self-locking in the mounting state such that when grasping and handling only one of the two housing parts (2) the other housing part (50) does not fall off.

5. The connection and junction box (1) according to claim 3, wherein in the mounting state, the first (50) of the two housing parts protrudes the second (2) of the two housing parts at the side facing the solar module such that when putting the connection and junction box (1) on the solar module (24), firstly only the first housing part (50) engages the solar module (24), and whereat the shifting of the second housing part (2) with respect to the first housing part (50) is caused by applying a force to the second housing part (2) in the direction towards the solar module (24), for closing the contact clamp (22) by means of the actuation arrangement (18).

6. The connection and junction box (1) according to claim 3, wherein the housing (3) is formed at least two-piece, and the first (50) of the two housing parts is formed as bottom element for engaging the solar module (24), and the second (2) of the two housing parts is formed as cap part, and at least one of the two housing parts (2, 50) has circumferential side walls (2a-d) so that the first and the second housing part (2, 50) together define, except for predefined openings, a closed and at least impermeable to splash-water box for the connection arrangement (1), when the housing (3) is fixedly connected with the solar module (24) in the contacting state.

7. The connection and junction box (1) according to claim 3, wherein the cap part (2) has a circumferential lip (8) with a glue notch for gluing the cap part (2) on the surface (24a) of the solar module (24).

8. The connection and junction box (1) according to claim 7, wherein the contact clamp (22) is formed as a spring force clamp with a clamp spring (32) and a counter clamp element (36), wherein the spring force clamp is open of its own accord in the mounting state, and may be closed by applying a force by means of the actuation arrangement (18).

9. The connection and junction box (1) according to claim 1, wherein the clamp spring (32) and/or the counter clamp element (36) is pivotably mounted at the connection arrangement (20), and the electrical contact with the flexible flat conductor band (28) is closed by pivoting at least at least one of the clamp spring (32) or the counter clamp element (36) in response to actuating by means of the actuation arrangement (18).

10. The connection and junction box (1) according to claim 9, wherein the contact clamp (22) has a latching mechanism (54, 55), by means of which the contact spring (32) is latched in the contacting state.

11. The connection and junction box (1) according to claim 1, wherein, when putting on the connection and junction box (1), the flexible flat conductor band (28) is
   either substantially resistance-less inserted through the insertion mouth (26) directly into the open insertion area (1) of the open contact clamp (22), or
   substantially resistance-less inserted through the insertion mouth (26) into an open intermediate area (30) in the housing (3), and the connection and junction box (1) has a deflection arrangement (21) for the flexible flat conductor band (28), which arrangement bends the flexible flat conductor band (28) into the catch area (31) of the contact clamp.

12. A photovoltaic solar module (24) having at least one flexible flat conductor band (28) protruding from the surface (24a), and at least one connection and junction box (1) according to claim 1, mounted onto the solar module (24).

13. A method for connecting a connection and junction box (1) to a photovoltaic solar module (24), comprising the steps of:
   providing a solar module (24) having at least one flexible flat conductor band (28) protruding from the surface (24a) of the solar module (24),
   providing a connection and junction box (1) comprising a housing (3) and a connection arrangement (20), which is positioned in the housing (3), with a contact clamp (22) for establishing a clamp contact with the flexible flat conductor band (28), and having an insertion mouth (26) at the lower side of the connection and junction box (1) as well as an actuation arrangement for actuating the contact clamp (22),
   putting the connection and junction box (1) on the solar module (24), wherein the connection and junction box (1) is put over the flexible flat conductor band (28) with the insertion mouth (26),
   inserting the flexible flat conductor band (28) into the catch area (31) of the open contact clamp (22), either when or after putting the connection and junction box (1) over the flexible flat conductor band (28),
   causing a movement of two housing parts (2, 50) with respect to each other, whereby the contact clamp (22) by is closed means of the actuation arrangement (18), and at this the flexible flat conductor band (28) is contacted.

14. The method according to claim 13, wherein the housing (3) comprises a bottom element (50) and a cap part (2), wherein the connection device (20) is attached at the bottom element (50), and is slideable together with the bottom element (50 with respect to the cap part (2), wherein the sliding device (14, 15) is superably self-locking so that the bottom element (50) and the connection device (20) do not drop off the cap part (2), when putting the connection and junction box (1) on the solar module (24), wherein the bottom element (50) downwards protrudes from the cap part (2) so that, when putting on the solar module (24), at first only the bottom element (50) engages the surface (24*a*) of the solar module, wherein a force is applied to the cap part (2) towards the solar module (24) such that the cap part (2) is shifted with respect to the bottom element (50) and to the connection device (20) till the cap part (2) also engages the solar module (24), wherein the contact clamp (22) is automatically closed in response to the relative movement of the cap part (2) and the bottom element (50).

\* \* \* \* \*